(12) United States Patent
Karpman et al.

(10) Patent No.: US 6,686,993 B1
(45) Date of Patent: Feb. 3, 2004

(54) PROBE CARD FOR TESTING OPTICAL MICRO ELECTROMECHANICAL SYSTEM DEVICES AT WAFER LEVEL

(75) Inventors: Maurice S. Karpman, Brookline, MA (US); Nicholas Pizzi, Jr., Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 325 days.

(21) Appl. No.: 09/799,887

(22) Filed: Mar. 5, 2001

(51) Int. Cl.[7] ............................................. G01N 21/00
(52) U.S. Cl. .................................................. 356/237.1
(58) Field of Search ................................ 235/487, 492, 235/451, 454; 356/445, 124, 237.5, 237.1

(56) References Cited

U.S. PATENT DOCUMENTS 5,227,642 A * 7/1993 Shimizu ..................... 250/566
6,052,197 A   4/2000 Drake
6,088,474 A   7/2000 Dudasko et al.

OTHER PUBLICATIONS

"Ceramic Blade Probes"; data sheet of Cerprobe Corp.; Cerprobe Corporation, 1150 N. Fiesta Blvd., Gilbert, AZ 85233; Mar., 2000.
"CerCard Probe Cards: Advanced Cantilever Technology"; article from Cerprobe Corp., 1150 N. Fiesta Blvd., Gilbert, AZ 85233; Mar., 2000.
"Near IR Sensitive Liquid Crystal Light Valve with Hydrogenated Amorphous Silicon Photoconductor"; by Piyi Du et al.; IEEE Transactions on Electron Devices, vol. 43, Feb. 1996; pp. 360–362.
"A Micromachined Angled Hall Magnetic Field Sensor Using Novel In–Cavity Patterning"; by M. Paranjape et al.; Transducers '97; IEEE; 1997 International Conference on Solid–State Sensors and Actuators, Chicago; Engineering Information Inc., Hoboken, New Jersey 07030; pp. 397–400.

* cited by examiner

Primary Examiner—Diane I. Lee
Assistant Examiner—Jamara A. Franklin
(74) Attorney, Agent, or Firm—Samuels, Gauthier & Stevens, LLP

(57) ABSTRACT

A probe card characterizes optical structures formed on a MEMS wafer. The probe includes a substrate having a circuit thereon. The substrate has an opening wherein a plurality of metal probes, electrically coupled to the circuit, pass through the opening. The probe card further includes an optical test device electrically coupled to the circuit. The optical test device includes a light source and a photosensitive area. The photosensitive area receives directly light reflected from the optical structures. The optical test device can be positioned directly over the opening, or the optical test device can be positioned on a periphery of the opening. Furthermore, the optical test device can be positioned so as to provide a test light beam that is parallel to the wafer to test pop-up optical MEMS components. The optical test device also may be positioned between the probe card and the MEMS wafer.

43 Claims, 3 Drawing Sheets

PROBE CARD FOR TESTING OPTICAL MICRO ELECTROMECHANICAL SYSTEM DEVICES AT WAFER LEVEL

FIELD OF THE INVENTION

The present invention relates generally to a probe card for testing optical micro electromechanical system (MEMS) devices at wafer level. More particularly, the present invention relates to providing an optical test device on a probe card to enable optical and electrical testing of the electrical and optical components of an optical MEMS wafer and characterization thereof at the wafer level.

BACKGROUND OF THE INVENTION

Conventional probe cards have been used to test the electrical properties and functionality of electrical components on a wafer at the wafer level. Conventional testing at the wafer level allows the fabricator to test the wafer to find the defective dies. The identified defective die can then be discarded prior to package, thus increasing the yield rate of the electronic packages. This is desirable because of the significant cost difference between a die and a package, the package costs being the greater of the two.

An example of the top view of a conventional probe card is illustrated in FIG. 1. As illustrated in FIG. 1, a probe card 1 includes an opening 3 through which a plurality of electrical probes 5 extends to contact a wafer under test. In this example, the wafer under test includes optical MEMS devices in the form of rotatable mirrors 7. The electrical probes 5 are aligned to contact pads on the wafer under test. Moreover, the electrical probes 5 are electrically coupled to a circuit for providing electrical signals to the wafer under test as well as for receiving electrical signals from the wafer under test. The circuit on the probe card 1 uses the signals to determine if the components under test are defective or not. If the components are determined defective, the die associated with the defective components can be discarded. The testing circuit and electrical probes 5 could also be located on the side of the probe card 1 that is adjacent to the wafer under test, thereby eliminating the need for the opening 3.

FIG. 2 illustrates a side view of the probe card 1 of FIG. 1. As illustrated in FIG. 2, a probe card 1 includes an opening 3 through which a plurality of electrical probes 5 extends to contact a wafer under test 9. In this example, the wafer under test 9 includes optical MEMS devices in the form of rotatable mirrors 7. The electrical probes 5 are aligned to contact pads on the wafer under test 9. Moreover, the electrical probes 5 are electrically coupled to a circuit for providing electrical signals to the wafer under test 9 as well as for receiving electrical signals from the wafer under test. The circuit on the probe card 1 uses the signals to determine if the components under test are defective or not. If the components are determined defective, the die associated with the defective components can be discarded.

As described above, conventional testing of integrated circuits and optical MEMS devices utilize a probe card that tests these circuits at the wafer level. The testing is accomplished by having the electrical probes of the probe card make temporary contact with the device. From the testing, the device can be characterized before it is singulated and assembled into a package, thereby increasing the yield rate of the assembled packages. However, conventional probe cards do not test for the optical performance of the optical MEMS device at the wafer level.

To determine the characterization of a die having optical MEMS devices thereon, both the electrical and optical performance criteria need to be tested. For example, for optical MEMS devices having movable mirrors, both the electrical components controlling the angle or rotation of the mirrors and the optical performance of the mirrors as the mirrors are placed into position need to be tested. Conventionally, the optical performance of optical MEMS devices are tested and characterized after the die having the optical MEMS devices thereon has been singulated from the wafer and assembled into a package. This decreases the yield rates of the assembled packages because defective optical MEMS devices are no being detected until after packaging.

Testing of a MEMS mirror at an individual component level could be done in a manner very similar to what is described above. However, the drawback is that in order to test each mirror chip, the chip would need to be mounted on a suitable fixture that provides a means to supply the mirror's actuation signal. This fixture would then mounted such that a deflectable surface of the mirror was aligned correctly with respect to the incoming laser beam. The mirror would then be tested and if it met specifications it could be assembled and if not acceptable it would be discarded. Testing in this manner would be slow, tedious, and would subject the mirror chips to considerable handling risk that would be compounded by the fragile nature of the mirror's deflectable plate and the very small size of the chip itself (as for example 0.7 mm×1.5 mm).

Probe control stations equipped with device-specific probe cards are used in the semiconductor industry for the wafer level testing of integrated circuits. These machines allow for the rapid and automated testing of a plurality of circuits patterned onto a wafer. Devices tested in this manner can be rejected and appropriately marked at the wafer level if they don't perform to specifications, thus, simplifying the sorting of good from bad parts. Connection to a computer allows for the transfer and storage of the test results for later retrieval and analysis. Such systems have been typically applied to electrical testing of discrete semiconductor devices or semiconductor integrated circuits. What is needed is a method for testing the electrical-optical-mechanical performance of MEMS devices at the wafer level in a manner that is compatible with the high volume manufacturing procedures.

An example of a method of testing the electrical-optical-mechanical performance of MEMS devices at the wafer level in a manner that is compatible with the high volume manufacturing procedures is disclosed in U.S. Pat. No. 6,052,197. U.S. Pat. No. 6,052,197 discloses an electro-optic probe assembly that is used to perform a wafer level test of a torsional micro-machined mirror. In operation, the electro-optic probe assembly is connected to a control station. The electro-optic probe assembly is oriented horizontally and parallel to the surface of a control station wafer support stage.

A wafer is placed on the support stage and held in place with vacuum. The control station provides for vertical translation such that probes can be raised out of contact with the wafer as needed. Prior to testing, the probes are aligned to the wafer surface such that the probes electrically connect to a set of mirror drive pads. Once the probes are in contact with the drive pads, computer-controlled testing of the mirror device proceeds. A laser beam is directed and focused onto a reflective rotatable plate of an individual mirror on the wafer and the mirror plate vectored by a changing electrical charge applied to the mirror drive pads. The tests involve electro-optical-mechanical characterization of return laser light deflection as the mirror plate is vectored, with overall results sent to a computer for storage and data reduction. At the end of the test, the probes and the drive pads are separated.

Although U.S. Pat. No. 6,052,197 discloses the testing of optical MEMS devices at the wafer level, the testing device has many disadvantages. For example, the testing device uses a complex optical path, requiring special beam splitters. The use of such beam splitters increases the cost of a probe card. Also, the inclusion of these optical components in the probe card introduces possible distortion detecting the light. Lastly, the conventional probe cards are not able to provide a test light beam that is parallel to the wafer for testing pop-up mirrors or pop-up optical MEMS devices.

Thus, it is desirable to provide a compact probe card that is capable of electrically and optically testing at the wafer level a wafer having optical MEMS devices. Moreover, it is desirable to test these devices using the light being directly reflected off the optical structures to avoid any unnecessary distortion. Furthermore, it is desirable to provide a probe card capable of providing a test light beam that is parallel to the wafer for testing pop-up mirrors or pop-up optical MEMS devices.

SUMMARY OF THE INVENTION

One aspect of the present invention is a probe card for characterizing optical structures formed on a wafer. The probe card includes a substrate having a circuit thereon, the substrate having an opening therethrough; a plurality of metal probes being electrically coupled to the circuit and passing through the opening; and an optical test device being electrically coupled to the circuit. The optical test device includes a light source and a photosensitive area, the photosensitive area receiving directly light reflected from the optical structures.

Another aspect of the present invention is a probe card for characterizing optical micro electromechanical system devices, having a plurality of mirrors, formed on a wafer at the wafer level. The probe card includes a substrate having a circuit thereon, the substrate having an opening therethrough; a plurality of metal probes being electrically coupled to the circuit and passing through the opening; and an optical test device being electrically coupled to the circuit. The optical test device includes a light source and a photosensitive area the photosensitive area receiving directly light reflected from the optical structures. The circuit activates individual mirrors through the metal probes. The metal probes are electrically coupled to pads on a die having the optical micro electromechanical system devices located on the wafer. The circuit causes individual mirrors to be positioned at different predetermined angles. The optical test device measures light from the light source reflected from the angled mirror with the photosensitive area, and the circuit characterizes a functionality of each individual mirror based upon a measured output of the photosensitive area.

A third aspect of the present invention is a method for characterizing an integrated circuit having optical micro electromechanical system devices, including a plurality of mirrors, formed on a wafer at the wafer level. The method tests an integrated circuit with a probe card, the probe card making electrical contact with the integrated circuit to test its electrical functionality. The probe card includes a substrate having a circuit thereon, the substrate having an opening therethrough and a plurality of metal probes being electrically coupled to the circuit and passing through the opening. The method further tests the optical micro electromechanical system devices with the probe card. The probe card further includes an optical test device being electrically coupled to the circuit, the optical test device including a light source and a photosensitive area, the photosensitive area receiving directly light reflected from the optical structures. The testing of the optical micro electromechanical system devices is realized by activating individual mirrors to be positioned at different predetermined angles, and measuring light from the light source reflected from the angled mirror with the photosensitive area. The method characterizes an optical functionality of each individual mirror based upon a measured output of the photosensitive area.

A fourth aspect of the present invention is a probe card for characterizing optical structures formed on a wafer. The probe card includes a substrate having a circuit thereon; a plurality of metal probes being electrically coupled to the circuit, the plurality of metal probes being positioned on a side of the substrate adjacent to the wafer under test; and an optical test device being electrically coupled to the circuit. The optical test device includes a light source and a photosensitive area and is located on a side of the substrate adjacent to the wafer under test. The photosensitive area receives directly light reflected from the optical structures.

A fifth aspect of the present invention is a probe card for characterizing optical micro electromechanical system devices, having a plurality of mirrors, formed on a wafer at the wafer level. The probe card includes a substrate having a circuit thereon; a plurality of metal probes being electrically coupled to the circuit, the plurality of metal probes being positioned on a side of the substrate adjacent to the wafer under test; and an optical test device being electrically coupled to the circuit and being located on a side of the substrate adjacent to the wafer under test. The optical test device includes a light source and a photosensitive area, the photosensitive area receiving directly light reflected from the optical structures. The circuit activates individual mirrors through the metal probes, and the metal probes are electrically coupled to pads on a die having the optical micro electromechanical system devices located on the wafer. The circuit causes individual mirrors to be positioned at different predetermined angles. The optical test device measures light from the light source reflected from the angled mirror with the photosensitive area, and the circuit characterizes a functionality of each individual mirror based upon a measured output of the photosensitive area.

A sixth aspect of the present invention is a method for characterizing an integrated circuit having optical micro electromechanical system devices, including a plurality of mirrors, formed on a wafer at the wafer level. The method tests an integrated circuit with a probe card. The probe card makes electrical contact with the integrated circuit to test its electrical functionality. The probe card includes a substrate having a circuit thereon and a plurality of metal probes being electrically coupled to the circuit, the plurality of metal probes being positioned on a side of the substrate adjacent to the wafer under test. The method further tests the optical micro electromechanical system devices with the probe card. The probe card further includes an optical test device being electrically coupled to the circuit, the optical test device including a light source and a photosensitive area, the photosensitive area receiving directly light reflected from the optical structures. The optical test device is located on a side of the substrate adjacent to the wafer under test. The testing of the optical micro electromechanical system devices is realized by activating individual mirrors to be positioned at different predetermined angles, and measuring light from the light source reflected from the angled mirror with the photosensitive area. The method characterizes an optical functionality of each individual mirror based upon a measured output of the photosensitive area.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE INVENTION

Figure 1:
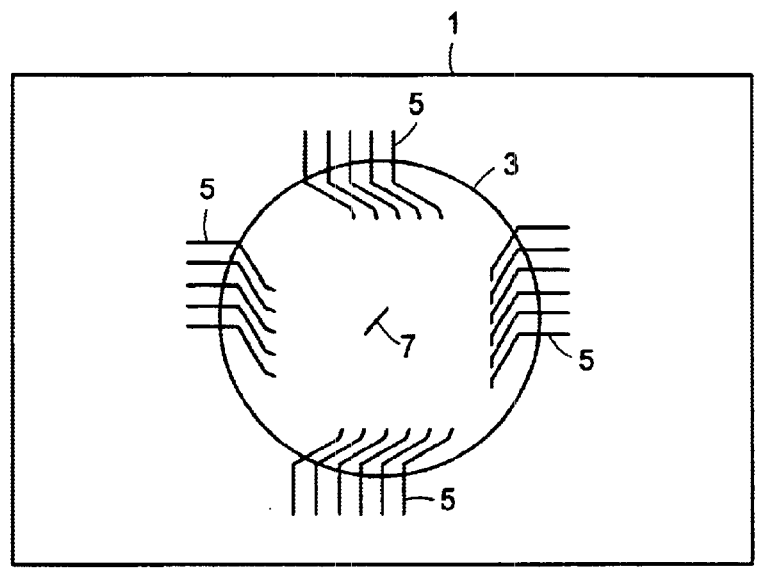
FIG. 1 is a top view of a conventional probe card for testing circuits located on a wafer.
Figure 2:
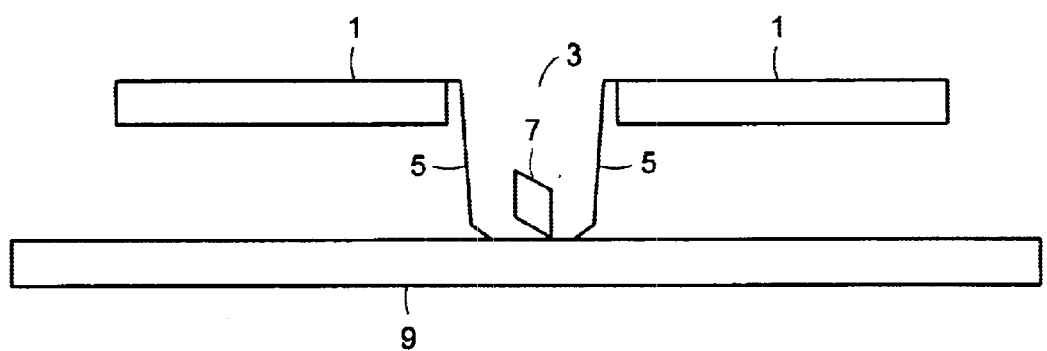
FIG. 2 is a side view of the conventional probe card of FIG. 1.
Figure 3:
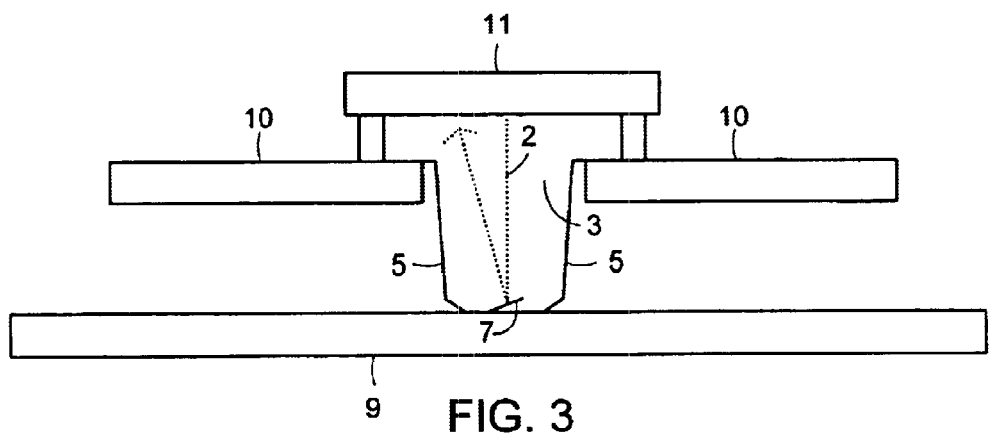
FIG. 3 is a side view of a probe card according to one embodiment of the present invention.

As noted above, the present invention is directed to a probe card for testing optical micro electromechanical system (MEMS) devices at wafer level. FIG. 3 illustrates an embodiment according to the concepts of the present invention.

As illustrated in FIG. 3, a probe card 10 includes an optical test device 11 mounted thereon. In this embodiment, the optical test device 11 is mounted over an opening 3 in the probe card 10. The probe card 10 includes a plurality of electrical probes 5 that come in contact with pads upon the wafer 9 under test. The wafer 9 under test has optical MEMS devices fabricated thereon, such as rotatable mirrors 7 that need to be tested for both electrical and optical performance. Collimated light 2 from the optical test device 11 is directed to the mirror 7 and reflected directly back to the optical test device 11.

Figure 6:
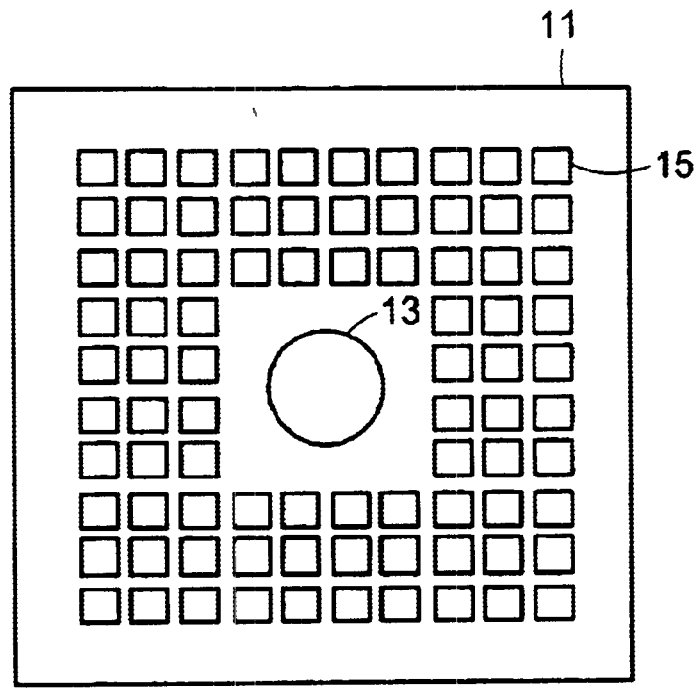
FIG. 6 is a top view of the probe card of FIG. 3.

The actual positioning of the collimated light source and light detection area is illustrated in FIG. 6. As illustrated in FIG. 6, the optical test device 11 includes a collimated light source 13 positioned at its center. A light detection area 15 surrounds the collimated light source 13. In a preferred embodiment, the light detection area 15 is a plurality of photodiodes arranged in an array.

In the operation of the probe card 10 of FIG. 3, collimated light 2 from the collimated light source 13 is directed upon a mirror or mirrors 7 wherein the mirror or mirrors 7 have been placed into a test position by the probe card through the plurality of electrical probes 5 supplying control signals to the optical MEMS devices on the wafer 9 under test. Collimated light 2 is reflected by the mirror or mirrors 7 under test and detected by the light detection area 15 directly. Other optical devices are not included to redirect the reflected collimated light 2 is incidence upon the light detection area 15, thereby reducing errors due to distortion of the collimated light beam.

Figure 4:
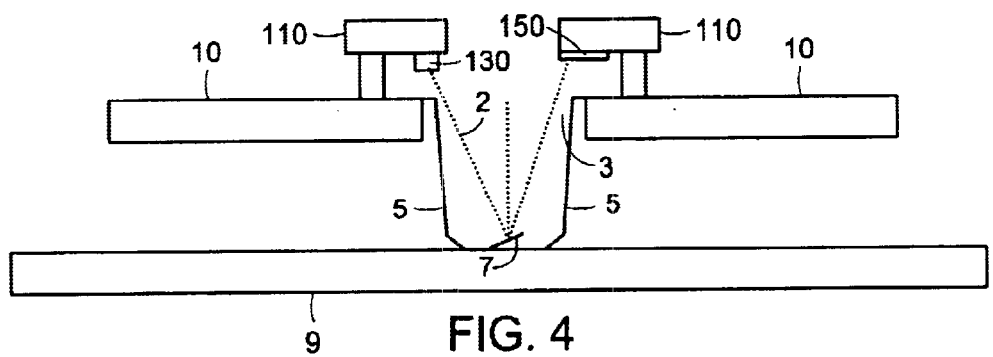
FIG. 4 is a side view of a probe card according to another embodiment of the present invention.

FIG. 4 illustrates another embodiment according to the concepts of the present invention. As illustrated in FIG. 4, a probe card 10 includes an optical test device 110 mounted thereon. In this embodiment, the optical test device 110 is mounted around a periphery of an opening 3 in the probe card 10. The probe card 10 includes a plurality of electrical probes 5 that come in contact with pads upon the wafer 9 under test. The wafer 9 under test has optical MEMS devices fabricated thereon, such as rotatable mirrors 7 that need to be tested for both electrical and optical performance. Collimated light 2 from the optical test device 110 is directed to the mirror 7 and reflected directly back to the optical test device 110.

The actual positioning of a collimated light source 130 and light detection area 150 is further illustrated in FIG. 4. As illustrated in FIG. 4, the collimated light source 130 of the optical test device 110 is positioned along the periphery of the opening 3 on one side thereof. The light detection area 150 of the optical test device 110 is positioned along the periphery of the opening 3 on an opposite side from the collimated light source 130. In a preferred embodiment, the light detection area 150 is a plurality of photodiodes arranged in an array.

In the operation of the probe card 10 of FIG. 4, collimated light 2 from the collimated light source 130 is directed upon a mirror or mirrors 7 wherein the mirror or mirrors 7 have been placed into a test position by the probe card through the plurality of electrical probes 5 supplying control signals to the optical MEMS devices on the wafer 9 under test. Collimated light 2 is reflected by the mirror or mirrors 7 under test and detected by the light detection area 150 directly. Other optical devices are not included to redirect the reflected collimated light 2 before the reflected collimated light 2 is incidence upon the light detection area 150, thereby reducing errors due to distortion of the collimated light beam.

Figure 5:
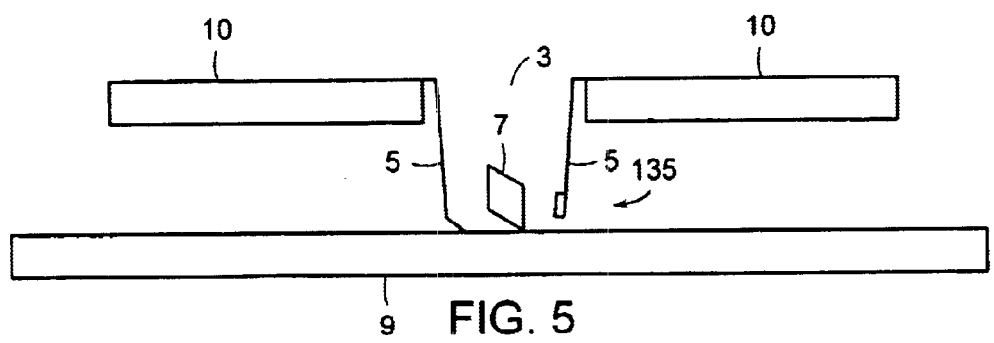
FIG. 5 is a side view of a probe card according to a third embodiment of the present invention.

FIG. 5 illustrates a third embodiment according to the concepts of the present invention. As illustrated in FIG. 5, a probe card 10 includes an optical test components 135 mounted the ends of some of electrical probes 5. In this embodiment, the optical test components 135 are mounted at the ends of some of the electrical probes 5 to provide collimated light in a path parallel to the wafer 9 under test. Parallel collimated light is critical in testing optical MEMS devices, such as mirrors 7, that pop-up from the surface of the wafer. The optical test components 135 are located around a periphery of an opening 3, as in FIG. 4, but the optical test devices located in close proximity to the wafer to provide parallel light testing. The probe card 10 also includes a plurality of electrical probes 5 that come in contact with pads upon the wafer 9 under test.

Figure 7:
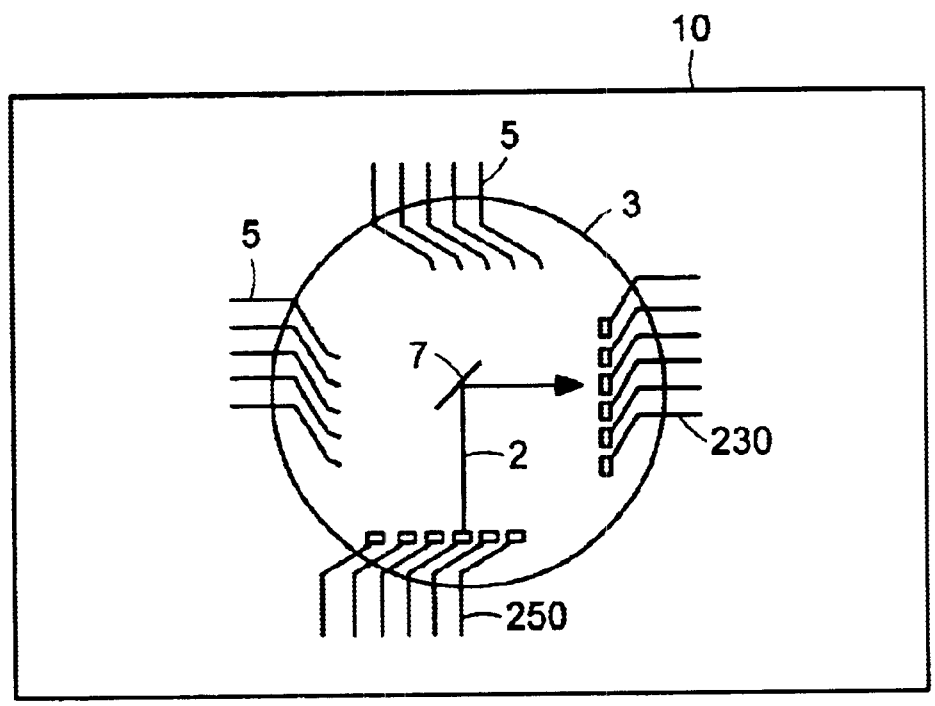
FIG. 7 is a top view of the probe card of FIG. 5.

The actual positioning of collimated light sources and light detection components is illustrated in FIG. 7. As illustrated in FIG. 7, the probe card 10 includes a plurality of collimated light sources 250 mounted at the ends of some of the electrical probes 5 to provide collimated light 2 in a path parallel to the wafer 9 under test. Light detection components 230 are mounted at the ends of some of the electrical probes 5 to provide detection of collimated light 2 in a path parallel to the wafer 9 under test. In a preferred embodiment, the light detection components 230 are photodiodes.

In the operation of the probe card 10 of FIG. 5, collimated light from an optical test component 135 capable of producing collimated light source is directed upon a pop-up up mirror or mirrors 7 wherein the pop-up mirror or mirrors 7 have been placed into a test position by the probe card through the plurality of electrical probes 5 supplying control signals to the optical MEMS devices on the wafer 9 under test. Collimated light is reflected by the pop-up mirror or mirrors 7 under test and detected by an optical test component 135 being capable of detecting light directly. Other optical devices are not included to redirect the reflected collimated light before the reflected collimated light is incidence upon an optical test component 135 being capable of detecting light, thereby reducing errors due to distortion of the collimated light beam.

In another embodiment of FIGS. 5 and 7, the light sources 250 are a product of a single collimated light source (not shown) mounted on the probe card 10. The optical test component 135, with respect to the light sources 250, includes a plurality of optical fibers for channeling light from the collimated light source (not shown) mounted on the probe card 10 to the optical structures 7. Moreover, the light detection components 230 are a plurality of fiber optics for channeling light reflected from the optical structures 7 to the array of photodiodes mounted on the probe card 10. The metal probes 5 provide support and positioning for the fiber optics.

Using the above described probe cards, an integrated circuit having optical micro electromechanical system devices, including a plurality of mirrors, formed on a wafer can be characterized at the wafer level. The integrated circuit is tested with the probe card with the probe card making electrical contact with the integrated circuit to test its electrical functionality. In one embodiment, the probe card includes a substrate having a circuit thereon, and the substrate has an opening therethrough wherein a plurality of metal probes is electrically coupled to the circuit through the opening. The optical micro electromechanical system devices are also tested with the probe card. The probe card further includes an optical test device being electrically coupled to the circuit wherein the optical test device includes a light source and a photosensitive area. The individual mirrors are positioned at different predetermined angles, and light from the light source reflected from the angled mirror is measured with the photosensitive area. The optical functionality of each individual mirror is characterized based upon a measured output of the photosensitive area. The integrated circuit is rejected at the wafer level before further processing when the characterization of the optical functionality falls below a predetermined threshold. Moreover, the optical micro electromechanical system devices can be trimmed when the characterization of the optical functionality is greater than a first predetermined threshold and the optical functionality is below a second predetermined threshold. This trimming process can be repeated until the die can no longer be trimmed or it comes in compliance with the acceptable performance criteria.

In summary, the present invention provides a compact probe card that is capable of electrically and optically testing at the wafer level a wafer having optical MEMS devices. Moreover, the present invention provides a compact probe card that is capable of testing these devices using the light being directly reflected off the optical structures to avoid any unnecessary distortion. Furthermore, the present invention provides a compact probe card that is capable of providing a test light beam that is parallel to the wafer for testing pop-up mirrors or pop-up optical MEMS devices.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A probe card for characterizing optical structures formed on a wafer, comprising:
   a substrate having a circuit thereon, said substrate having an opening therethrough;
   a plurality of metal probes being electrically coupled to said circuit and passing through said opening; and
   an optical test device being electrically coupled to said circuit;
   said optical test device including a light source and a photosensitive area;
   said photosensitive area receiving directly light reflected from the optical structures.

2. The probe card as claimed in claim 1, wherein said optical test device is positioned directly over said opening.

3. The probe card as claimed in claim 2, wherein said light source is a collimated light source positioned in a center of the optical test device and said photosensitive area is an array of photodiodes surrounding the collimated light source.

4. The probe card as claimed in claim 1, wherein said optical test device is positioned on a periphery of said opening.

5. The probe card as claimed in claim 3, wherein said light source is a collimated light source positioned on one side of a periphery of said opening and said photosensitive area is an array of photodiodes positioned opposite the collimated light source on the periphery of said opening.

6. The probe card as claimed in claim 1, wherein a first portion of said metal probes are positioned so as to make contact with pads on a die located on the wafer;
   a second portion of said metal probes having light sources positioned thereon, said second portion of metal probes passing through said opening and being positioned such that light from said light sources is incident upon the optical structures, said second portion of said metal probes providing electrical power to said light sources; and
   a third portion of said metal probes having light sensors positioned thereon, said third portion of metal probes passing through said opening and being positioned such that light reflected from the optical structures is incident upon the light sensors, said third portion of said metal probes receiving electrical signals from said light sensors.

7. The probe card as claimed in claim 1, wherein said photosensitive area is an array of photodiodes.

8. The probe card as claimed in claim 1, wherein said light source is a collimated light source positioned on substrate and said photosensitive area is an array of photodiodes positioned on the substrate;
   said optical test device further including a plurality of optical fibers for channeling light from the collimated light source to the optical structures and for channeling light reflected from the optical structures to the array of photodiodes;
   a set of said metal probes providing support and positioning for the fiber optics.

9. The probe card as claimed in claim 1, wherein said circuit is a printed circuit board on said substrate.

10. The probe card as claimed in claim 1, wherein said substrate is ceramic.

11. The probe card as claimed in claim 1, wherein said substrate and said circuit thereon is a flexible circuit.

12. The probe card as claimed in claim 1, wherein said optical test device is mechanically coupled to said substrate.

13. A probe card for characterizing optical micro electromechanical system devices, having a plurality of mirrors, formed on a wafer at the wafer level, comprising:
- a substrate having a circuit thereon, said substrate having an opening therethrough;
- a plurality of metal probes being electrically coupled to said circuit and passing through said opening; and
- an optical test device being electrically coupled to said circuit;
- said optical test device including a light source and a photosensitive area;
- said photosensitive area receiving directly light reflected from the optical structures;
- said circuit activating individual mirrors through said metal probes;
- said metal probes being electrically coupled to pads on a die having the optical micro electromechanical system devices located on the wafer;
- said circuit causing individual mirrors to be positioned at different predetermined angles;
- said optical test device measuring light from the light source reflected from the angled mirror with the photosensitive area;
- said circuit characterizing a functionality of each individual mirror based upon a measured output of the photosensitive area.

14. The probe card as claimed in claim 13, wherein said optical test device is positioned directly over said opening.

15. The probe card as claimed in claim 13, wherein said optical test device is positioned on a periphery of said opening.

16. The probe card as claimed in claim 13, further comprising:
- a second plurality of metal probes having light sources positioned thereon, said second plurality of metal probes passing through said opening and being positioned such that light from said light sources is incident upon the mirrors of the optical micro electromechanical system devices, said second plurality of metal probes providing electrical power to said light sources; and
- a third plurality of metal probes having light sensors positioned thereon, said third plurality of metal probes passing through said opening and being positioned such that light reflected from the mirrors of the optical micro electromechanical system devices is incident upon the light sensors, said third plurality of metal probes receiving electrical signals from said light sensors.

17. The probe card as claimed in claim 13, wherein said photosensitive area is an array of photodiodes.

18. The probe card as claimed in claim 13, wherein said light source is a collimated light source and said photosensitive area is an array of photodiodes surrounding the collimated light source.

19. The probe card as claimed in claim 13, wherein said light source is positioned on one side of a periphery of said opening and said photosensitive area is positioned opposite the light source on the periphery of said opening.

20. The probe card as claimed in claim 13, wherein said light source is a collimated light source positioned on substrate and said photosensitive area is an array of photodiodes positioned on the substrate;
- said optical test device further including a plurality of optical fibers for channeling light from the collimated light source to the optical structures and for channeling light reflected from the optical structures to the array of photodiodes;
- a set of said metal probes providing support and positioning for the fiber optics.

21. The probe card as claimed in claim 13, wherein said circuit is a printed circuit board on said substrate.

22. The probe card as claimed in claim 13, wherein said substrate is ceramic.

23. The probe card as claimed in claim 13, wherein said substrate and said circuit thereon is a flexible circuit.

24. The probe card as claimed in claim 13, wherein said optical test device is mechanically coupled to said substrate.

25. A method for characterizing an integrated circuit having optical micro electromechanical system devices, including a plurality of mirrors, formed on a wafer at the wafer level, comprising:
- (a) testing an integrated circuit with a probe card, the probe card making electrical contact with the integrated circuit to test electrical functionality, the probe card including a substrate having a circuit thereon, the substrate having an opening therethrough and a plurality of metal probes being electrically coupled to the circuit and passing through the opening;
- (b) testing the optical micro electromechanical system devices with the probe card, the probe card further including an optical test device being electrically coupled to the circuit, the optical test device including a light source and a photosensitive area, the photosensitive area receiving directly light reflected from the optical structures;
- said testing the optical micro electromechanical system devices with the probe card including:
    - (b1) activating individual mirrors to be positioned at different predetermined angles, and
    - (b2) measuring light from the light source reflected from the angled mirror with the photosensitive area; and
- (c) characterizing an optical functionality of each individual mirror based upon a measured output of the photosensitive area.

26. The method as claimed in claim 25, further comprising:
- (d) rejecting the integrated circuit at the wafer level before further processing when the characterization of the optical functionality falls below a predetermined threshold.

27. The method as claimed in claim 25, further comprising:
- (d) rejecting the integrated circuit at the wafer level before further processing when the characterization of the optical functionality falls below a first predetermined threshold; and
- (e) electrically trimming the optical micro electromechanical system devices when the characterization of the optical functionality is greater than the first predetermined threshold and the optical functionality is below a second predetermined threshold.

28. The method as claimed in claim 25, further comprising:
- (d) rejecting the integrated circuit at the wafer level before further processing when the characterization of the optical functionality falls below a first predetermined threshold;
- (e) electrically trimming the optical micro electromechanical system devices when the characterization of the optical functionality is greater than the first predetermined threshold and the optical functionality is below a second predetermined threshold;

(f) repeating said steps (a)–(c), after executing said step (e).

29. A probe card for characterizing optical structures formed on a wafer, comprising:
   a substrate having a circuit thereon;
   a plurality of metal probes being electrically coupled to said circuit, said plurality of metal probes being positioned on a side of said substrate adjacent to the wafer under test; and
   an optical test device being electrically coupled to said circuit;
   said optical test device including a light source and a photosensitive area and being located on a side of said substrate adjacent to the wafer under test;
   said photosensitive area receiving directly light reflected from the optical structures.

30. The probe card as claimed in claim 29, wherein a first portion of said metal probes are positioned so as to make contact with pads on a die located on the wafer;
   a second portion of said metal probes having light sources positioned thereon, said second portion of metal probes being positioned such that light from said light sources is incident upon the optical structures, said second portion of said metal probes providing electrical power to said light sources; and
   a third portion of said metal probes having light sensors positioned thereon, said third portion of metal probes being positioned such that light reflected from the optical structures is incident upon the light sensors, said third portion of said metal probes receiving electrical signals from said light sensors.

31. The probe card as claimed in claim 29, wherein said photosensitive area is an array of photodiodes.

32. The probe card as claimed in claim 29, wherein said light source is a collimated light source positioned in a center of the optical test device and said photosensitive area is an array of photodiodes surrounding the collimated light source.

33. The probe card as claimed in claim 29, wherein said light source is a collimated light source positioned on substrate and said photosensitive area is an array of photodiodes positioned on the substrate;
   said optical test device further including a plurality of optical fibers for channeling light from the collimated light source to the optical structures and for channeling light reflected from the optical structures to the array of photodiodes;
   a set of said metal probes providing support and positioning for the fiber optics.

34. The probe card as claimed in claim 29, wherein said optical test device is mechanically coupled to said substrate.

35. A probe card for characterizing optical micro electromechanical system devices, having a plurality of mirrors, formed on a wafer at the wafer level, comprising:
   a substrate having a circuit thereon;
   a plurality of metal probes being electrically coupled to said circuit, said plurality of metal probes being positioned on a side of said substrate adjacent to the wafer under test; and
   an optical test device being electrically coupled to said circuit and being located on a side of said substrate adjacent to the wafer under test;
   said optical test device including a light source and a photosensitive area;
   said photosensitive area receiving directly light reflected from the optical structures;
   said circuit activating individual mirrors through said metal probes;
   said metal probes being electrically coupled to pads on a die having the optical micro electromechanical system devices located on the wafer;
   said circuit causing individual mirrors to be positioned at different predetermined angles;
   said optical test device measuring light from the light source reflected from the angled mirror with the photosensitive area;
   said circuit characterizing a functionality of each individual mirror based upon a measured output of the photosensitive area.

36. The probe card as claimed in claim 35, further comprising:
   a second plurality of metal probes having light sources positioned thereon, said second plurality of metal probes being positioned such that light from said light sources is incident upon the mirrors of the optical micro electromechanical system devices, said second plurality of metal probes providing electrical power to said light sensors; and
   a third plurality of metal probes having light sensors positioned thereon, said third plurality of metal probes being positioned such that light reflected from the mirrors of the optical micro electromechanical system devices is incident upon the light sensors, said third plurality of metal probes receiving electrical signals from said light sensors.

37. The probe card as claimed in claim 35, wherein said light source is a collimated light source and said photosensitive area is an array of photodiodes surrounding the collimated light source.

38. The probe card as claimed in claim 35, wherein said light source is a collimated light source and said photosensitive area is an array of photodiodes;
   said optical test device further including a plurality of optical fibers for channeling light from the collimated light source to the optical structures and for channeling light reflected from the optical structures to the array of photodiodes;
   a set of said metal probes providing support and positioning for the fiber optics.

39. The probe card as claimed in claim 35, wherein said optical test device is mechanically coupled to said substrate.

40. A method for characterizing an integrated circuit having optical micro electromechanical system devices, including a plurality of mirrors, formed on a wafer at the wafer level, comprising:
   (a) testing an integrated circuit with a probe card, the probe card making electrical contact with the integrated circuit to test electrical functionality, the probe card including a substrate having a circuit thereon and a plurality of metal probes being electrically coupled to the circuit, the plurality of metal probes being positioned on a side of the substrate adjacent to the wafer under test;
   (b) testing the optical micro electromechanical system devices with the probe card, the probe card further including an optical test device being electrically coupled to the circuit, the optical test device including a light source and a photosensitive area and being located on a side of the substrate adjacent to the wafer under test, the photosensitive area receiving directly light reflected from the optical structures;

said testing the optical micro electromechanical system devices with the probe card including:
  (b1) activating individual mirrors to be positioned at different predetermined angles, and
  (b2) measuring light from the light source reflected from the angled mirror with the photosensitive area; and
(c) characterizing an optical functionality of each individual mirror based upon a measured output of the photosensitive area.

41. The method as claimed in claim 40, further comprising:
  (d) rejecting the integrated circuit at the wafer level before further processing when the characterization of the optical functionality falls below a predetermined threshold.

42. The method as claimed in claim 40, further comprising:
  (d) rejecting the integrated circuit at the wafer level before further processing when the characterization of the optical functionality falls below a first predetermined threshold; and
  (e) electrically trimming the optical micro electromechanical system devices when the characterization of the optical functionality is greater than the first predetermined threshold and the optical functionality is below a second predetermined threshold.

43. The method as claimed in claim 40, further comprising:
  (d) rejecting the integrated circuit at the wafer level before further processing when the characterization of the optical functionality falls below a first predetermined threshold;
  (e) electrically trimming the optical micro electromechanical system devices when the characterization of the optical functionality is greater than the first predetermined threshold and the optical functionality is below a second predetermined threshold;
  (f) repeating said steps (a)–(c), after executing said step (e).

* * * * *